United States Patent [19]
Kim

[11] Patent Number: 5,853,604
[45] Date of Patent: Dec. 29, 1998

[54] METHOD OF PLANARIZING AN INSULATING LAYER IN A SEMICONDUCTOR DEVICE

[75] Inventor: Sang Yong Kim, Kyungki-Do, Rep. of Korea

[73] Assignee: Hyundai Electronics Industries, Co., Ltd., Kyungki-Do, Rep. of Korea

[21] Appl. No.: 877,635

[22] Filed: Jun. 19, 1997

[30] Foreign Application Priority Data

Jun. 21, 1996 [KR] Rep. of Korea ................. 96-22804

[51] Int. Cl.⁶ ............................................. H01L 21/302
[52] U.S. Cl. ......................... 216/88; 438/692; 438/734; 438/750
[58] Field of Search ................. 216/88, 89; 438/692, 438/693, 734, 750

[56] References Cited

U.S. PATENT DOCUMENTS

| | | | |
|---|---|---|---|
| 3,691,694 | 9/1972 | Goetz et al. ............................ | 51/80 |
| 5,081,421 | 1/1992 | Miller et al. ........................... | 156/627 |
| 5,536,202 | 7/1996 | Appel et al. . | |
| 5,643,405 | 7/1997 | Bello et al. ........................... | 156/636.1 |
| 5,733,177 | 3/1998 | Tsuchiya et al. ...................... | 451/41 |

*Primary Examiner*—R. Bruce Breneman
*Assistant Examiner*—George Goudreau
*Attorney, Agent, or Firm*—Scott C. Harris, Esq.

[57] ABSTRACT

The present invention discloses a method of planarizing an insulating layer of a semiconductor device. The method of the present invention comprises a first polishing step for rotating the platen and the rotating carrier holding the wafer contacted with the polishing pad secured to the platen, applying a nitrogen ($N_2$) gas to the rear surface of the wafer to contact a surface of the wafer with the polishing pad, and applying force to the wafer through the rotating carrier to press the wafer against the polishing pad. Then, a second polishing step for increasing a speed of revolution of the platen and the rotating carrier and decreasing the force applied to the wafer is performed.

7 Claims, 1 Drawing Sheet

METHOD OF PLANARIZING AN INSULATING LAYER IN A SEMICONDUCTOR DEVICE

BACKGROUND OF THE INVENTION

1. Field of the Invention

The present invention relates to a method of planarizing an insulating layer in a semiconductor device and, more particularly, to a method of planarizing an insulating layer in a semiconductor device using a chemical mechanical polishing apparatus.

2. Description of the Prior Arts

In a manufacturing process of a semiconductor device, the conducting layer is generally formed as a multi-layer structure. Therefore an electrical insulation between the conducting layers and a planarization are inevitably required. For the insulation and planarization, the insulating layer is formed using an insulating materials which has an excellent planarity property such as BPSG (boron-phosphor silicate glass), SOG (spin-on-glass), etc.

However, the higher an integration of the semiconductor device is, the narrower a width of the pattern of conductive layer is and the thicker a thickness of the insulating layer is. Therefore, a topology of the surface of the insulating layer becomes more bigger, it is difficult to proceed a subsequent due to an overall poor planarization.

For this reason, in recent years, after forming an insulating layer, the surface of the insulating layer is planarized by a chemical mechanical polishing apparatus. Then, the chemical mechanical polishing apparatus which is generally used will be now explained by reference to FIG. 1.

FIG. 1 shows a structure of a general chemical mechanical polishing (CMP) apparatus. The CMP apparatus 10 comprises a polishing pad 3 secured to a platen 2. During polishing, the platen 2 is rotated by rotation of a shaft 1. The CMP apparatus 10 further comprises a rotating carrier 6 fixed to a shaft 7. A bottom of the rotating carrier 6 has recesses for holding a wafer 5. The rotating carrier 6 is rotatable to rotate the wafer 5 and is operable to position the wafer 5 on polishing pad 3.

In operation, the rotating carrier 6 and the polishing pad 3 are rotated, respectively, and a slurry 4 is continuously introduced to the surface of the polishing pad 3. At this time, the platen 2 is rotated at speed of revolution of 26 through 30 r.p.m. (revolutions per minute), and the rotating carrier 6 is rotated at speed of revolution of 28 through 34 r.p.m. Also, the rotating carrier 6 applies force of 5 through 9 psi (pound per square inches) to press the wafer 5 against the polishing pad 3. A gas such as nitrogen ($N_2$) is applied to the rear surface of the wafer 5 through a passage formed in the rotating carrier 6 to contact a surface of the wafer 5 with the polishing pad 3.

Then, the insulating layer formed on the wafer 5 is reacted with the slurry 4 and the insulating layer reacted with the slurry 4 is polished by the polishing pad 3. As a result, planarization of the insulating layer formed on the wafer 5 is accomplished.

When the above mentioned chemical mechanical polishing apparatus 10 is used for planarizing the insulating layer, the degree of polish is varied according to the amount of the slurry 4 introduced to the surface of the polishing pad 3 (chemical fact) and the force applied to the wafer 5 (mechanical fact).

However, since a center portion and an edge portion of the wafer 5 are ununiformly polished, a difference in planarity between the center portion and the edge portion of the wafer is obtained as shown in FIG 2.

SUMMARY OF THE INVENTION

It is therefore an object of the present invention to provide a method of planarizing an insulating layer in a semiconductor device which can solve the above mentioned problems by controlling a force applied to the wafer and a speed of revolution of the rotating carrier (wafer) and the plate (polishing pad).

The present invention uses a conventional chemical mechanical polishing apparatus. The method of the present invention comprises a first polishing step for rotating the platen and the rotating carrier holding the wafer contacted with the polishing pad secured to the platen, applying a nitrogen ($N_2$) gas to the rear surface of the wafer to contact a surface of the wafer with the polishing pad, and applying force to the wafer through the rotating carrier to press the wafer against the polishing pad. After performing the first polishing is completed, a second polishing step for increasing a speed of revolution of the platen and the rotating carrier and decreasing the force applied to the wafer is performed continuously.

The force applied to the wafer through the rotating carrier is 5 through 9 psi in the first polishing step, and the force applied to the wafer is decreased to 1 through 4 psi in the second polishing step. Also, the speed of revolution of the platen and the rotating carrier in the first polishing step are 26 through 30 r.p.m and 28 through 34 r.p.m., respectively, the speed of revolution of the platen and the rotating carrier in the second polishing step are increased to 28 through 32 r.p.m and 64 through 94 r.p.m., respectively.

BRIEF DESCRIPTION OF THE DRAWINGS

Other objects and advantages of the present invention will be understood by reading the detailed explanation of the embodiment with reference to the accompanying drawings in which.

DESCRIPTION OF THE INVENTION

Figure 1:
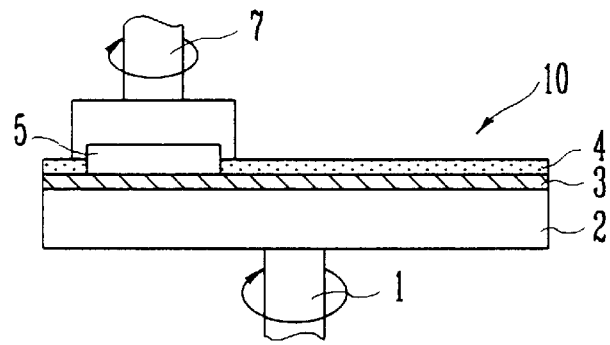
FIG. 1 is a schematic view showing a structure of a general chemical mechanical polishing apparatus.
Figure 2:
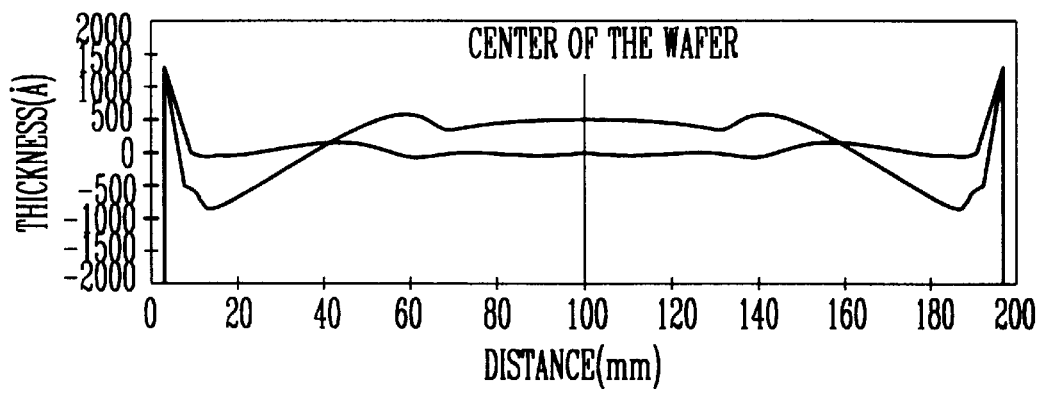
FIG. 2 is a graph for showing a surface of the wafer which was planarized by means of a conventional method of planarizing an insulating layer.

The present invention also employs the chemical mechanical polishing apparatus constructed as shown in FIG. 1. In the present invention, the polishing process is performed by two steps so as to remove the difference in the degree of planarization between the center portion and the edge portion of the wafer.

In the first polishing step

The rotating carrier 6 and the polishing pad 3 are rotated, respectively, and a slurry 4 is introduced to the surface of the polishing pad 3. At this time, the platen 2 is rotated at speed of revolution of 26 through 30 r.p.m., and the rotating carrier 6 is rotated at speed of revolution of 28 through 34 r.p.m. Also, the rotating carrier 6 applies force of 5 through 9 psi to press the wafer 5 against the polishing pad 3. A gas such as nitrogen ($N_2$) is applied to the rear surface of the wafer 5 through a passage formed in the rotating carrier 6 to contact a surface of the wafer 5 with the polishing pad 3.

Then, the insulating layer formed on the wafer 5 is reacted with the slurry 4, and the insulating layer reacted with the slurry 4 is polished by the polishing pad 3.

In the second polishing step

The rotating carrier 6 and the polishing pad 3 are continuously rotated, respectively, and a slurry 4 is continuously introduced to the surface of the polishing pad 3. In the second polishing step, the platen 2 is rotated at speed of revolution of 28 through 32 r.p.m., and the rotating carrier 6 is rotated at speed of revolution of 64 through 94 r.p.m. Also, the rotating carrier 6 applies force of 1 through 4 psi to press the wafer 5 against the polishing pad 3. The $N_2$ gas is not applied to the wafer 5. As a result, planarization of the insulating layer formed on the wafer 5 is completed In the present invention, the second step is performed continually without delay in time after performing the first process.

Figure 3:
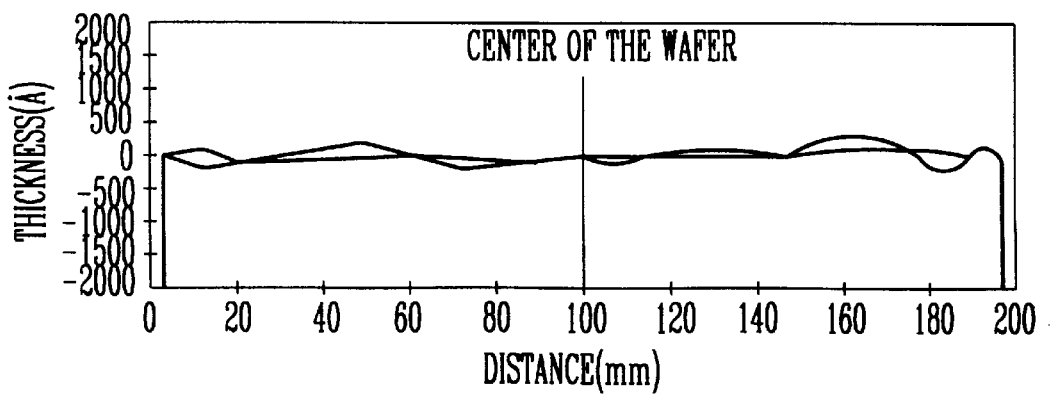
FIG. 3 is a graph for showing a surface of the wafer which was planarized by means of a method of planarizing an insulating layer.

As shown in FIG. 3, the entire surface of the wafer is uniformly planarized by means of the present invention. In case of using the above mentioned method, even though the insulating layer is not planarized during the first polishing step, the insulating layer can be uniformly planarized by means of the second polishing step.

As mentioned above, the insulating can be uniformly planarized by controlling the force applied to the wafer and the speed of revolution of the wafer (the rotating carrier) and the polishing pad during performing two polishing steps.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of planarizing an insulating layer of a semiconductor device using a chemical mechanical polish apparatus which comprises a rotatable platen, a polishing pad secured to said platen and a rotating carrier having recesses for holding a wafer, said rotating carrier operated to position said wafer on said polishing pad, the method comprising steps of:

a first polishing step for rotating said platen and said rotating carrier holding said wafer contacted with said polishing pad secured to said platen, applying a nitrogen ($N_2$) gas to the rear surface of the wafer to contact a surface of said wafer with the polishing pad, and applying force to said wafer through said rotating carrier to press said wafer against said polishing pad;

a second polishing step for increasing a speed of revolution of said platen and said rotating carrier and decreasing the force applied to said wafer.

2. The method of planarizing an insulating layer of a semiconductor device as claimed in claim 1, wherein said force applied to said wafer through said rotating carrier in said first polishing step is 5 through 9 psi.

3. The method of planarizing an insulating layer of a semiconductor device as claimed in claim 1, wherein said nitrogen ($N_2$) is applied through a passage formed in said rotating carrier at pressure of 0.5 through 1 psi.

4. The method of planarizing an insulating layer of a semiconductor device as claimed in claim 1, wherein, the speed of revolution of said platen and said rotating carrier in said first polishing step are 26 through 30 r.p.m and 28 through 34 r.p.m., respectively.

5. The method of planarizing an insulating layer of a semiconductor device as claimed in claim 1, wherein said force applied to said wafer through said rotating carrier in the second polishing step is 1 through 4 psi.

6. The method of planarizing an insulating layer of a semiconductor device as claimed in claim 1, wherein, the speed of revolution of said platen and said rotating carrier in said second polishing step are 28 through 32 r.p.m and 64 through 94 r.p.m., respectively.

7. The method of planarizing an insulating layer of a semiconductor device as claimed in claim 1, wherein said first polishing step and said the second polishing step are performed continuously.

\* \* \* \* \*